United States Patent
Huang et al.

(10) Patent No.: US 8,368,153 B2
(45) Date of Patent: Feb. 5, 2013

(54) WAFER LEVEL PACKAGE OF MEMS MICROPHONE AND MANUFACTURING METHOD THEREOF

(75) Inventors: Chien-Hsin Huang, Taichung (TW); Li-Che Chen, Pingtung (TW); Ming-I Wang, Tucheng (TW); Bang-Chiang Lan, Taipei (TW); Hui-Min Wu, Zhubei (TW); Tzung-I Su, Beigang Township, Yunlin County (TW)

(73) Assignee: United Microelectronics Corp., Hsinchu (TW)

( * ) Notice: Subject to any disclaimer, the term of this patent is extended or adjusted under 35 U.S.C. 154(b) by 197 days.

(21) Appl. No.: 12/756,982

(22) Filed: Apr. 8, 2010

(65) Prior Publication Data

US 2011/0248364 A1  Oct. 13, 2011

(51) Int. Cl.
*H01L 29/84* (2006.01)
*H01L 21/30* (2006.01)

(52) U.S. Cl. .......... 257/416; 257/414; 257/415; 438/48; 438/50; 438/51; 438/52; 438/53; 438/106; 29/594; 310/300; 310/331; 367/181; 381/150; 381/173; 381/174; 381/175; 381/369

(58) Field of Classification Search .................. 257/252, 257/254, 414, 419; 438/48, 50, 51, 53
See application file for complete search history.

(56) References Cited

U.S. PATENT DOCUMENTS

| | | | | |
|---|---|---|---|---|
| 4,453,045 A * | 6/1984 | Bruna | ............................ | 381/354 |
| 5,323,035 A * | 6/1994 | Leedy | ............................ | 257/248 |
| 5,485,304 A * | 1/1996 | Kaeriyama | .................... | 359/291 |
| 5,573,679 A * | 11/1996 | Mitchell et al. | ................... | 216/2 |
| 5,998,859 A * | 12/1999 | Griswold et al. | ............. | 257/679 |
| 6,121,688 A * | 9/2000 | Akagawa | ........................ | 257/778 |
| 6,350,668 B1 * | 2/2002 | Chakravorty | .................. | 438/612 |
| 6,535,460 B2 * | 3/2003 | Loeppert et al. | ............... | 367/181 |
| 6,635,509 B1 * | 10/2003 | Ouellet | .......................... | 438/106 |
| 6,657,832 B2 * | 12/2003 | Williams et al. | ................ | 361/15 |
| 6,677,225 B1 * | 1/2004 | Ellis et al. | ....................... | 438/598 |
| 6,713,314 B2 * | 3/2004 | Wong et al. | ...................... | 438/25 |
| 6,852,616 B2 * | 2/2005 | Sahara et al. | ................... | 438/613 |
| 6,936,524 B2 * | 8/2005 | Zhu et al. | ........................ | 438/459 |
| 7,056,759 B2 * | 6/2006 | Przybyla et al. | ................. | 438/53 |
| 7,132,307 B2 * | 11/2006 | Wang et al. | ...................... | 438/53 |
| 7,138,694 B2 * | 11/2006 | Nunan et al. | .................... | 257/419 |
| 7,152,481 B2 * | 12/2006 | Wang | ............................... | 73/718 |
| 7,193,292 B2 * | 3/2007 | Liaw | .............................. | 257/529 |
| 7,202,101 B2 * | 4/2007 | Gabriel et al. | .................. | 438/53 |
| 7,288,424 B2 * | 10/2007 | Hunter et al. | ................... | 438/48 |
| 7,329,933 B2 * | 2/2008 | Zhe et al. | ....................... | 257/419 |
| 7,348,646 B2 * | 3/2008 | Barzen et al. | ................... | 257/417 |
| 7,449,356 B2 * | 11/2008 | Weigold | .......................... | 438/53 |

(Continued)

*Primary Examiner* — Wai Sing Louie
*Assistant Examiner* — William Harriston
(74) *Attorney, Agent, or Firm* — Ding Yu Tan

(57) ABSTRACT

A wafer level package of micro electromechanical system (MEMS) microphone includes a substrate, a number of dielectric layers stacked on the substrate, a MEMS diaphragm, a number of supporting rings and a protective layer. The MEMS diaphragm is disposed between two adjacent dielectric layers. A first chamber is between the MEMS diaphragm and the substrate. The supporting rings are disposed in some dielectric layers and stacked with each other. An inner diameter of the lower supporting ring is greater than that of the upper supporting ring. The protective layer is disposed on the upmost supporting ring and covers the MEMS diaphragm. A second chamber is between the MEMS diaphragm and the protective layer. The protective layer defines a number of first through holes for exposing the MEMS diaphragm. The wafer level package of MEMS microphone has an advantage of low cost.

18 Claims, 4 Drawing Sheets

U.S. PATENT DOCUMENTS

| | | | |
|---|---|---|---|
| 7,449,366 B2 * | 11/2008 | Lee et al. | 438/115 |
| 7,536,769 B2 * | 5/2009 | Pedersen | 29/594 |
| 7,538,401 B2 * | 5/2009 | Eriksen et al. | 257/419 |
| 7,566,940 B2 * | 7/2009 | Sasagawa et al. | 257/419 |
| 7,572,660 B2 * | 8/2009 | Benzel et al. | 438/53 |
| 7,642,575 B2 * | 1/2010 | Wong et al. | 257/254 |
| 7,670,861 B2 * | 3/2010 | Hanaoka et al. | 438/53 |
| 7,795,063 B2 * | 9/2010 | Hsieh et al. | 438/53 |
| 7,804,969 B2 * | 9/2010 | Wang et al. | 381/174 |
| 7,805,821 B2 * | 10/2010 | Suzuki | 29/25.41 |
| 7,820,469 B2 * | 10/2010 | Leedy | 438/53 |
| 7,821,085 B2 * | 10/2010 | Suzuki et al. | 257/417 |
| 7,829,366 B2 * | 11/2010 | Miller et al. | 438/53 |
| 7,851,247 B2 * | 12/2010 | Shih | 438/53 |
| 7,851,925 B2 * | 12/2010 | Theuss et al. | 257/774 |
| 7,853,027 B2 * | 12/2010 | Yamaoka et al. | 381/174 |
| 7,856,804 B2 * | 12/2010 | Laming et al. | 57/416 |
| 7,875,485 B2 * | 1/2011 | Sasagawa et al. | 438/53 |
| 7,880,367 B2 * | 2/2011 | Nakatani | 310/331 |
| 7,884,431 B2 * | 2/2011 | Watanabe et al. | 257/415 |
| 7,885,423 B2 * | 2/2011 | Weigold | 381/174 |
| 7,906,841 B2 * | 3/2011 | Jeong et al. | 257/690 |
| 7,912,235 B2 * | 3/2011 | Chen | 381/174 |
| 7,923,790 B1 * | 4/2011 | Quevy et al. | 257/415 |
| 7,936,031 B2 * | 5/2011 | Sampsell et al. | 257/432 |
| 7,936,894 B2 * | 5/2011 | Zurek | 381/357 |
| 7,951,636 B2 * | 5/2011 | Lee et al. | 438/53 |
| 7,989,906 B2 * | 8/2011 | McAlexander, III | 257/419 |
| 8,004,053 B2 * | 8/2011 | Miyagi et al. | 257/417 |
| 8,033,838 B2 * | 10/2011 | Eldridge et al. | 439/81 |
| 8,035,176 B2 * | 10/2011 | Jung et al. | 257/415 |
| 8,063,458 B2 * | 11/2011 | Loeffler et al. | 257/419 |
| 8,067,811 B2 * | 11/2011 | Yamaoka et al. | 257/416 |
| 8,071,413 B2 * | 12/2011 | Wang | 438/50 |
| 8,093,119 B2 * | 1/2012 | Hsieh et al. | 438/199 |
| 8,120,125 B2 * | 2/2012 | Sasagawa et al. | 257/420 |
| 8,144,899 B2 * | 3/2012 | Song et al. | 381/184 |
| 8,155,355 B2 * | 4/2012 | Ogura et al. | 381/174 |
| 8,173,471 B2 * | 5/2012 | Hsieh et al. | 438/53 |
| 2001/0026951 A1 * | 10/2001 | Vergani et al. | 438/52 |
| 2002/0000649 A1 * | 1/2002 | Tilmans et al. | 257/678 |
| 2002/0024136 A1 * | 2/2002 | Grigg | 257/737 |
| 2002/0067663 A1 * | 6/2002 | Loeppert et al. | 367/181 |
| 2003/0007034 A1 * | 1/2003 | Horvath et al. | 347/50 |
| 2003/0053233 A1 * | 3/2003 | Felton | 359/883 |
| 2003/0133588 A1 * | 7/2003 | Pedersen | 381/423 |
| 2003/0139030 A1 * | 7/2003 | Grigg | 438/613 |
| 2004/0106221 A1 * | 6/2004 | Hunter et al. | 438/21 |
| 2005/0101047 A1 * | 5/2005 | Freeman et al. | 438/48 |
| 2005/0156314 A1 * | 7/2005 | Grigg | 257/737 |
| 2005/0227411 A1 * | 10/2005 | Grigg | 438/106 |
| 2006/0071324 A1 * | 4/2006 | Lu et al. | 257/704 |
| 2006/0093171 A1 * | 5/2006 | Zhe et al. | 381/191 |
| 2006/0105543 A1 * | 5/2006 | Xiao et al. | 438/459 |
| 2006/0203325 A1 * | 9/2006 | Faase et al. | 359/290 |
| 2006/0210106 A1 * | 9/2006 | Pedersen | 381/355 |
| 2006/0233400 A1 * | 10/2006 | Ohbayashi et al. | 381/175 |
| 2007/0121972 A1 * | 5/2007 | Suzuki et al. | 381/174 |
| 2007/0201710 A1 * | 8/2007 | Suzuki et al. | 381/174 |
| 2008/0083960 A1 | 4/2008 | Chen et al. | |
| 2008/0087971 A1 * | 4/2008 | Nakatani | 257/416 |
| 2008/0185669 A1 * | 8/2008 | Kok et al. | 257/416 |
| 2008/0233737 A1 * | 9/2008 | Liu | 438/637 |
| 2008/0247572 A1 * | 10/2008 | Langereis et al. | 381/174 |
| 2008/0267431 A1 * | 10/2008 | Leidl et al. | 381/173 |
| 2008/0283943 A1 * | 11/2008 | Dekker et al. | 257/415 |
| 2009/0026561 A1 * | 1/2009 | Reichenbach et al. | 257/416 |
| 2009/0041270 A1 * | 2/2009 | Schrank et al. | 381/174 |
| 2009/0047479 A1 * | 2/2009 | Nakatani et al. | 428/157 |
| 2009/0050989 A1 * | 2/2009 | Nakatani | 257/415 |
| 2009/0136064 A1 * | 5/2009 | Suzuki et al. | 381/174 |
| 2009/0180655 A1 | 7/2009 | Tien et al. | |
| 2009/0273043 A1 * | 11/2009 | Lee et al. | 257/416 |
| 2010/0044147 A1 * | 2/2010 | Wang | 181/164 |
| 2010/0065930 A1 * | 3/2010 | Nakatani | 257/415 |
| 2010/0067728 A1 * | 3/2010 | Chen | 381/361 |
| 2010/0072561 A1 * | 3/2010 | Lee et al. | 257/415 |
| 2010/0074458 A1 * | 3/2010 | Lan et al. | 381/150 |
| 2010/0084723 A1 * | 4/2010 | Chen et al. | 257/416 |
| 2010/0111344 A1 * | 5/2010 | Sun et al. | 381/355 |
| 2010/0164025 A1 * | 7/2010 | Yang | 257/416 |
| 2010/0193886 A1 * | 8/2010 | Nakatani et al. | 257/416 |
| 2010/0207217 A1 * | 8/2010 | Zuniga-Ortiz et al. | 257/415 |
| 2010/0213568 A1 * | 8/2010 | Hsu et al. | 257/496 |
| 2010/0277229 A1 * | 11/2010 | Lee et al. | 327/540 |
| 2010/0308450 A1 * | 12/2010 | Verjus et al. | 257/690 |
| 2010/0330722 A1 * | 12/2010 | Hsieh et al. | 438/53 |
| 2011/0057288 A1 * | 3/2011 | Tan et al. | 257/503 |
| 2011/0068374 A1 * | 3/2011 | Tan et al. | 257/254 |
| 2011/0079903 A1 * | 4/2011 | Liu | 257/738 |
| 2011/0084344 A1 * | 4/2011 | Huang et al. | 257/415 |
| 2011/0084394 A1 * | 4/2011 | Wu et al. | 257/773 |
| 2011/0123043 A1 * | 5/2011 | Felberer et al. | 381/94.2 |
| 2011/0131794 A1 * | 6/2011 | Chen | 29/594 |
| 2011/0180943 A1 * | 7/2011 | Claes et al. | 257/787 |
| 2011/0189804 A1 * | 8/2011 | Huang et al. | 438/53 |
| 2011/0205197 A1 * | 8/2011 | Sampsell et al. | 345/204 |
| 2011/0215672 A1 * | 9/2011 | Yamaoka et al. | 310/300 |
| 2011/0227177 A1 * | 9/2011 | Nakatani et al. | 257/416 |
| 2011/0300659 A1 * | 12/2011 | Hsieh et al. | 438/53 |
| 2012/0043629 A1 * | 2/2012 | Minervini | 257/416 |
| 2012/0090398 A1 * | 4/2012 | Lee et al. | 73/715 |
| 2012/0091546 A1 * | 4/2012 | Langereis et al. | 257/416 |
| 2012/0098076 A1 * | 4/2012 | Lee et al. | 257/416 |

\* cited by examiner

WAFER LEVEL PACKAGE OF MEMS MICROPHONE AND MANUFACTURING METHOD THEREOF

BACKGROUND

1. Field of the Invention

The present invention relates to a micro electromechanical system (MEMS) microphone, and particularly to a wafer level package of MEMS microphone and a manufacturing method thereof.

2. Description of the Related Art

Micro electromechanical system (MEMS) technique has established a whole new technical field and industry. The MEMS technique has been widely used in a variety of microelectronic devices that have electronic and mechanical properties, for example, pressure sensors, accelerators and micromicrophones. Since the MEMS microphone has the advantages of light, small and high signal quality, it gradually becomes the mainly stream of micro microphone.

FIG. 1 is a schematic view of a conventional package of MEMS microphone. Referring to FIG. 1, the conventional package 100 of MEMS microphone includes a MEMS chip 110 and a complementary metal oxide semiconductor (CMOS) chip 120 disposed on a substrate 130. The MEMS chip 110 and the CMOS chip 120 are covered by a metal cover 140 fixed on the substrate 130. The metal cover 140 is used for protecting the MEMS chip 110 and the CMOS chip 120. In addition, the metal cover 140 defines a number of sound receiving holes 142.

In the process of fabricating the conventional package 100 of MEMS microphone, a ratio of the package cost of the package process to the total production cost of the conventional package 100 of MEMS microphone is a percentage of 75%. Furthermore, a big package stress will be generated in the package process. Therefore, what is needed is a new package of MEMS microphone to overcome the above disadvantages and to reduce the production cost of the MEMS microphone.

BRIEF SUMMARY

The present invention provides a wafer level package of MEMS microphone so as to reduce the production cost.

The present invention also provides a manufacturing method for wafer level package of MEMS microphone so as to reduce the production cost.

To achieve the above-mentioned advantages, the present invention provides a wafer level package of MEMS microphone. The wafer level package of MEMS microphone includes a substrate, a number of dielectric layers, a MEMS diaphragm, a number of supporting rings and a protective layer. The dielectric layers are stacked on the substrate. The MEMS diaphragm is disposed between two adjacent dielectric layers of the dielectric layers. A first chamber is formed between the MEMS diaphragm and the substrate. The supporting rings are respectively disposed in some of the dielectric layers and are stacked with each other. An inner diameter of the lower supporting ring is greater than that of the upper supporting ring, and the upmost supporting ring is located in the upmost dielectric layer. The protective layer is disposed on the upmost supporting ring and covers the MEMS diaphragm. A second chamber is formed between the MEMS diaphragm and the protective layer. The protective layer defines a number of first through holes for exposing the MEMS diaphragm therefrom.

In one embodiment provided by the present invention, material of the supporting rings includes metal.

In one embodiment provided by the present invention, material of the protective layer is selected from a group consisting of plastic, dielectric material and metal.

In one embodiment provided by the present invention, the wafer level package of MEMS microphone further includes an electrode layer disposed either in the substrate or on the substrate. The electrode layer defines a number of second through holes corresponding to the MEMS diaphragm. The substrate defines a hollow region corresponding to the MEMS diaphragm.

In one embodiment provided by the present invention, the wafer level package of MEMS microphone further includes a guard ring. The guard ring is located in some of the dielectric layers under the MEMS diaphragm and surrounds the first chamber.

In one embodiment provided by the present invention, material of the guard ring includes metal.

In one embodiment provided by the present invention, the undermost supporting ring and the MEMS diaphragm are respectively coupled to the guard ring.

In one embodiment provided by the present invention, the wafer level package of MEMS microphone further includes a metal oxide semiconductor (MOS) component, a number of conductive wires arranged in different layers and a number of via plugs. The MOS component is disposed on the substrate and covered by the dielectric layers. The conductive wires, the via plugs and the dielectric layers form an interconnect structure electrically connecting to the MOS component. The dielectric layers and the conductive wires are stacked alternately. The via plugs are formed in the dielectric layers. Each via plug electrically connects to the two adjacent conductive wires corresponding thereto.

To achieve the above-mentioned advantages, the present invention provides a manufacturing method for wafer level package of MEMS microphone. The manufacturing method includes following processes. A number of dielectric layers are formed on a substrate in sequence, a MEMS diaphragm is formed between two adjacent dielectric layers of the dielectric layers, and a number of supporting rings are formed in some of the dielectric layers respectively. The supporting rings are stacked with each other. The upmost supporting ring is located in the upmost dielectric layer. An inner diameter of the lower supporting ring is greater than that of the upper supporting ring. Subsequently, a protective layer is formed on the upmost supporting ring to cover the MEMS diaphragm. The protective layer defines a number of first through holes. Afterwards, a first chamber is formed between the MEMS diaphragm and the substrate, and a second chamber is formed between the MEMS diaphragm and the protective layer.

In one embodiment provided by the present invention, before the dielectric layers are formed in sequence, an electrode layer is formed either in the substrate or on the substrate.

In one embodiment provided by the present invention, the process of forming the first chamber includes the steps of removing a portion of the substrate under the MEMS diaphragm to form a hollow region so as to expose the electrode layer, forming a number of second through holes in the electrode layer, and etching portions of the dielectric layers between the MEMS diaphragm and the electrode layer through the second through holes so as to form the first chamber.

In one embodiment provided by the present invention, material of the supporting rings includes metal.

In one embodiment provided by the present invention, material of the protective layer is selected from a group consisting of plastic, dielectric material and metal.

In one embodiment provided by the present invention, during forming the dielectric layers a guard ring is formed, and the undermost supporting ring is located on the guard ring and coupled to the guard ring.

In one embodiment provided by the present invention, before the dielectric layers are formed, a metal oxide semiconductor component is formed on the substrate, and then the dielectric layers are formed to cover the metal oxide semiconductor component.

In one embodiment provided by the present invention, during forming the dielectric layers a number of conductive wires and a number of via plugs are formed. The conductive wires, the via plugs and the dielectric layers form an interconnect structure electrically connecting to the metal oxide semiconductor component. The dielectric layers and the conductive wires are stacked alternately. The via plugs are formed in the dielectric layers. Each via plug electrically connects to the two adjacent conductive wires corresponding thereto.

In the wafer level package of MEMS microphone and the manufacturing method of wafer level package of MEMS microphone, the protective layer formed on the supporting ring is used to cover the MEMS diaphragm. Thus, the conventional package process using the metal cover is not need, thereby reducing the production cost of the MEMS microphone.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
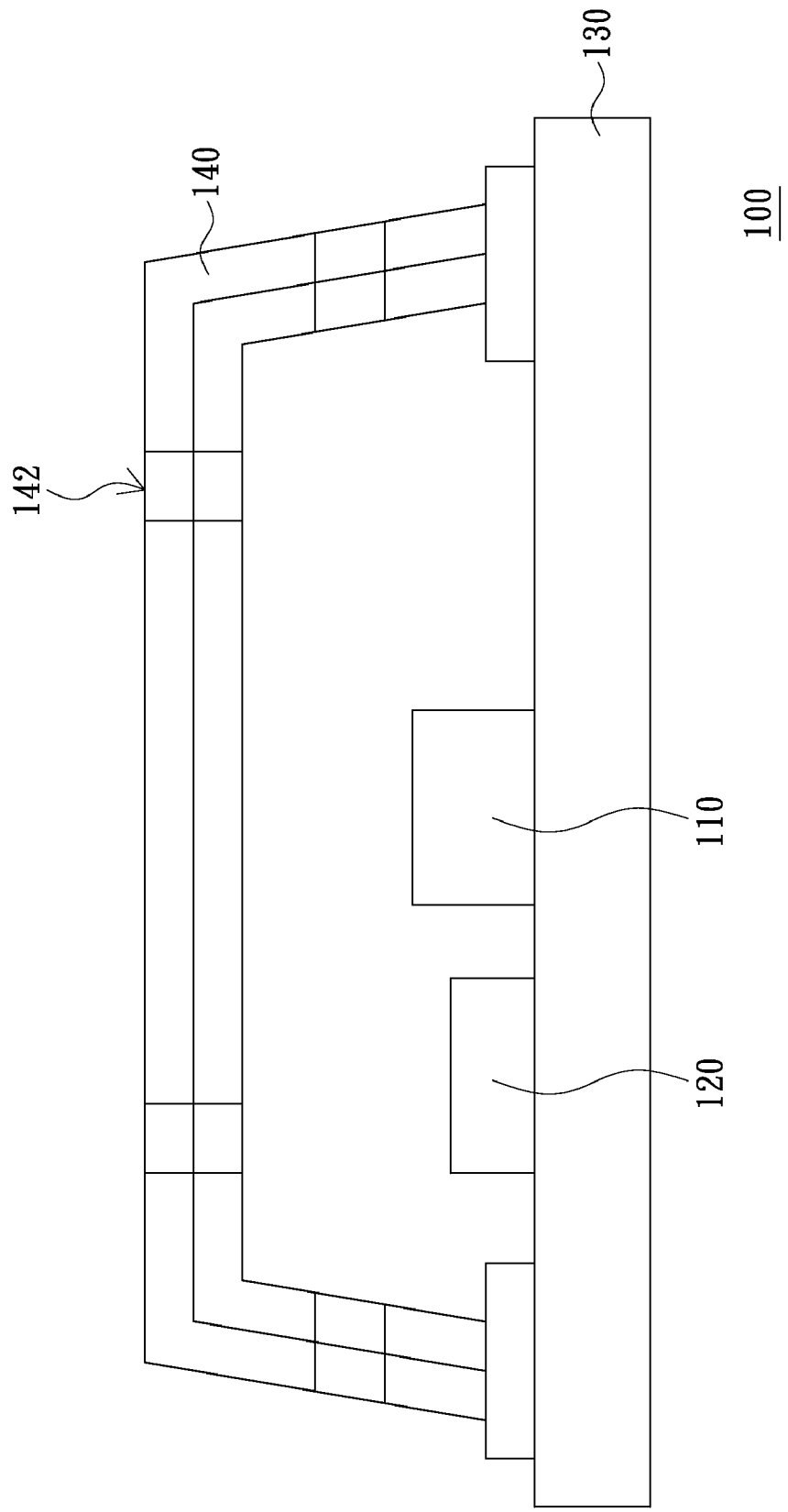
FIG. 1 is a schematic view of a conventional package of MEMS microphone.
Figure 2A:
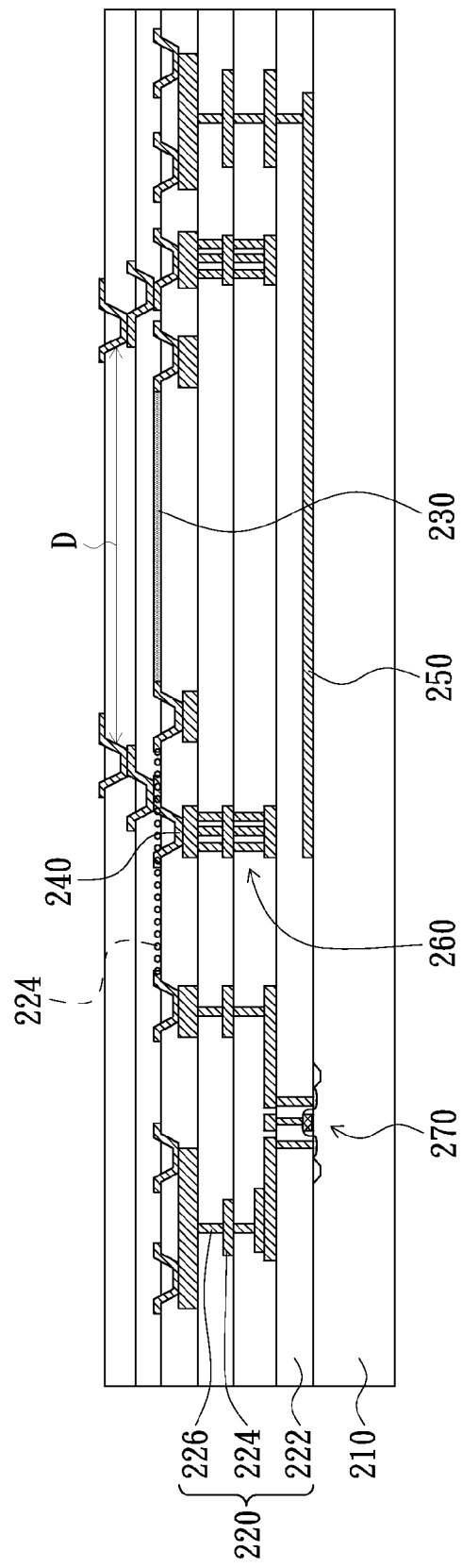
FIG. 2A to FIG. 2C are schematic flow charts of a manufacturing method for wafer level package of MEMS microphone in accordance with an embodiment of the present invention.
Figure 2B:
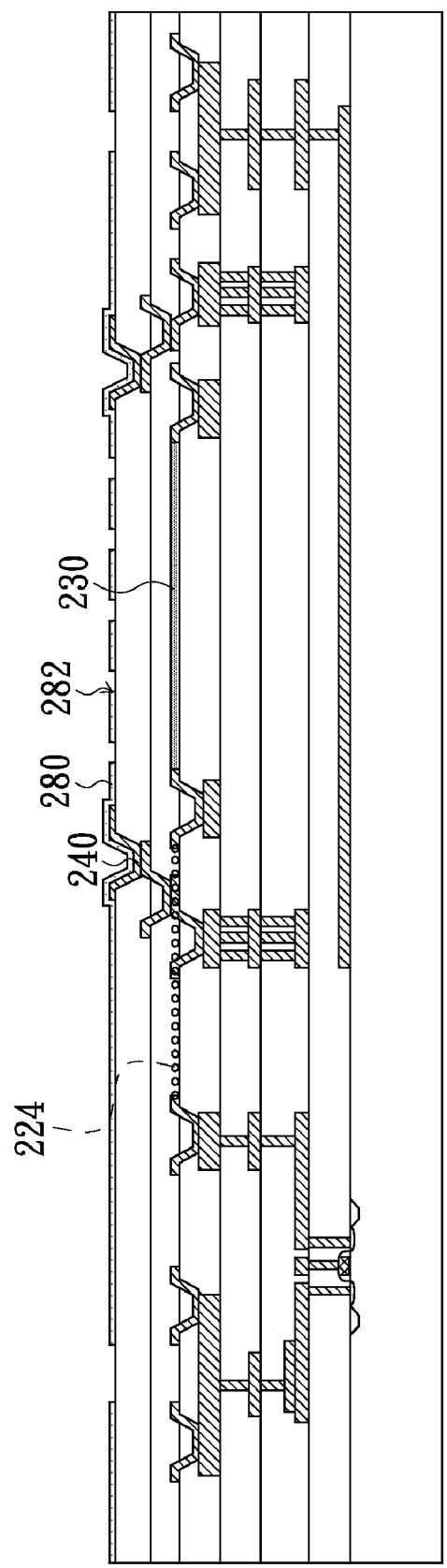
Figure 2C:
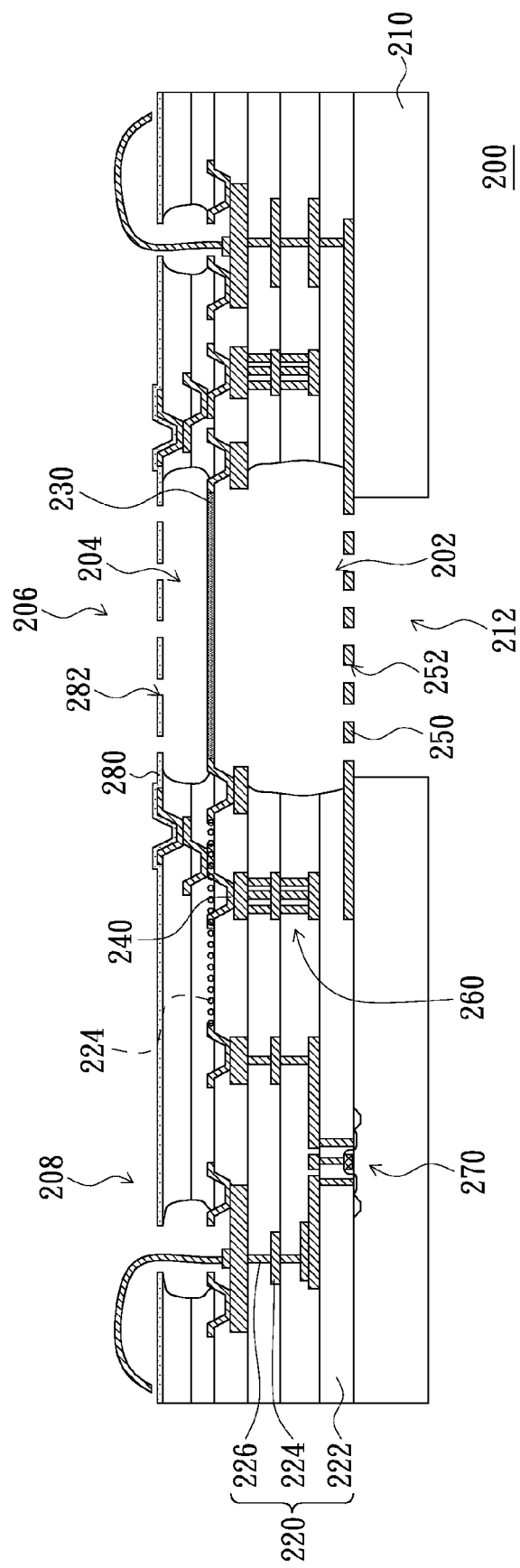

FIG. 2A to FIG. 2C are schematic flow charts of a manufacturing method for wafer level package of MEMS microphone in accordance with an embodiment of the present invention. Referring to FIG. 2A, in the manufacturing method for wafer level package of MEMS microphone, a number of dielectric layers 222 are formed on a substrate 210 in sequence, a MEMS diaphragm 230 is formed between two adjacent dielectric layers 222 of the dielectric layers 222, and a number of supporting rings 240 are formed in some of the dielectric layers 222 respectively. The supporting rings 240 are stacked with each other. The upmost supporting ring 240 is located in the upmost dielectric layer 222. An inner diameter of the lower supporting ring 240 is greater than that of the upper supporting ring 240. The inner diameter of the supporting ring 240 is labeled by D in FIG. 2A.

Material of the supporting rings 240 is, for example, metal. In the present embodiment, before the dielectric layers 222 are formed in sequence, an electrode layer 250 can be formed either in the substrate (not shown) or on the substrate 210, and then the dielectric layers 222 are formed to cover the electrode layer 250. Additionally, during forming the dielectric layer 222, a guard ring 260 can be formed in some of dielectric layers 222. The undermost supporting ring 240 may be located on the guard ring 260 and coupled to the guard ring 260. The guard ring 260 is composed of stacked metal layers. Material of the metal layers can be tungsten, aluminum, copper, titanium, titanium nitride, tantalum, tantalum nitride or any combination of other metal. Additionally, before the dielectric layers 222 are formed, a metal oxide semiconductor component 270 can be formed on the substrate 210, and then the dielectric layers 222 are formed to cover the metal oxide semiconductor component 270. Furthermore, during forming the dielectric layers 222, a number of conductive wires 224 and a number of via plugs 226 can be formed. The conductive wires 224, the via plugs 226 and the dielectric layers 222 form an interconnect structure 220. The interconnect structure 220 electrically connects to the metal oxide semiconductor component 270. The dielectric layers 222 and the conductive wires 224 are stacked alternately. The via plugs 226 are formed in the dielectric layers 222 and each via plug 226 electrically connects to the two adjacent conductive wires 224 corresponding thereto. The interconnect structure 220 shown in the FIG. 2A is a conventional interconnect structure. It is noted that the interconnect 220 can be replaced with an interconnect structure formed by a metal damascene process.

Subsequently, referring to FIG. 2B, a protective layer 280 is formed on the upmost supporting ring 240 to cover the MEMS diaphragm 230. The protective layer 280 is configured for preventing particles from dropping onto the MEMS diaphragm 230. The protective layer 280 defines a number of first through holes 282. The first through holes 282 can serve as sound receiving holes. Material of the protective layer 280 can be, but not limited to, insulating material with high tensile stress (e.g., silicon nitride, amorphous silicon, etc.) In addition, material of the protective layer 280 also can be plastic, dielectric material, metal, or other suitable material.

Afterwards, referring to FIG. 2C, a first chamber 202 is formed between the MEMS diaphragm 230 and the substrate 210 and a second chamber 204 is formed between the MEMS diaphragm 230 and the protective layer 280. In detail, in the present embodiment, for example, a portion of the substrate 210 under the MEMS diaphragm 230 is removed so as to form a hollow region 212. Thus, the electrode layer 250 is exposed from the hollow region 212. Then, a number of second through holes 252 are formed in the electrode layer 250. Portions of the dielectric layers 222 between the MEMS diaphragm 230 and the electrode layer 250 and portions of the dielectric layers 222 between the MEMS diaphragm 230 and the protective layer 280 are etched and removed through the second through holes 252 so as to form the first chamber 202 and the second chamber 204. In another embodiment, a number of preformed holes (not shown) having identical configurations to the second through holes 252 can be formed in the substrate 210 and the electrode layer 250, and then the portion of the substrate 210 under the MEMS diaphragm 230 is removed.

In the present embodiment, the portion of the substrate 210 under the MEMS diaphragm 230 may be removed using a dry etching method (e.g., deep reactive ion etching, DRIE). After the portion of the substrate 210 under the MEMS diaphragm 230 is removed, the portions of the dielectric layers 222 under the MEMS diaphragm 230 and above the MEMS diaphragm 230 are removed by hydrogen fluoride through the second through holes 252. Hydrogen fluoride can be either in a vapor status or in a liquid status. Thus, the first chamber 202 is formed between the MEMS diaphragm 230 and the electrode layer 250 and the second chamber 204 is formed between the MEMS diaphragm 230 and the protective layer 280. The first chamber 202 and the second chamber can respectively serve as a vibrating chamber. It is noted that the guard ring 260 can be used for avoiding over etching while the portion of the dielectric layers 222 under the MEMS diaphragm 230 is etched by the hydrogen fluoride. Thus, a logic circuit region 208 for disposing the metal oxide semiconductor component 270 thereon will not be damaged.

Further referring to FIG. 2C, a wafer level package 200 of MEMS microphone manufactured by using the above-mentioned method includes the substrate 210, the dielectric layers 222, the MEMS diaphragm 230, the supporting rings 240 and the protective layer 280. The dielectric layers 222 are stacked on the substrate 210. The MEMS diaphragm 230 is disposed between two adjacent dielectric layers 222 of the dielectric layers 222. The first chamber 202 is formed between the MEMS diaphragm 230 and the substrate 210. The supporting rings 240 are respectively disposed in some of the dielectric layers 222 and are stacked with each other. The inner diameter of the lower supporting ring 240 is greater than that of the upper supporting ring 240. The upmost supporting ring 240 is located in the upmost dielectric layer 222. The protective layer 280 is disposed on the upmost supporting ring 240 and covers the MEMS diaphragm 230. The second chamber 204 is formed between the MEMS diaphragm 230 and the protective layer 280. The protective layer 280 defines the first through holes 282 for exposing the MEMS diaphragm 230 therefrom.

The wafer level package 200 of MEMS microphone can further include the electrode layer 250 disposed either on the substrate 210 or in the substrate 210. The electrode layer 250 defines the second through holes 252 corresponding to the MEMS diaphragm 230. The substrate 210 defines the hollow region 212 corresponding to the MEMS diaphragm 230. Additionally, the wafer level package 200 of MEMS microphone can further include the guard ring 260. The guard ring 260 is located in some of the dielectric layers 222 under the MEMS diaphragm 230 and surrounds the first chamber 202. The undermost supporting ring 240 and the MEMS diaphragm 230 are respectively coupled to the guard ring 260.

The wafer level package 200 of MEMS microphone can further include the metal oxide semiconductor component 270, the conductive wires 224 arranged in different layers and the via plugs 226. The metal oxide semiconductor component 270 is disposed on the substrate 210 and covered by the dielectric layers 222. The dielectric layers 222 and the conductive wires 224 are stacked alternately. The via plugs 226 are formed in the dielectric layers 222. Each via plug 226 electrically connects to the two adjacent conductive wires 224 corresponding thereto. The conductive wires 224, the via plugs 226 and the dielectric layers 222 form the interconnect structure 220. The interconnect structure 220 electrically connects to the metal oxide semiconductor component 270.

In other words, in the present embodiment, the wafer level package 200 of MEMS microphone includes a logic circuit region 208 and a MEMS region 206. The MEMS region 206 electrically connects to the logic circuit region 208 through the conductive wire 224 (shown as a dotted line) of the interconnect structure 220. In the present embodiment, a sound signal passes through the first through holes 282 in the protective layer 280 and applies a pressure onto the MEMS diaphragm 230 so that the MEMS diaphragm 230 is vibrated. A capacitance value between an electrode layer (not shown) of the MEMS diaphragm 230 and the electrode layer 250 will be changed due to the vibration of the MEMS diaphragm 230. The capacitance value then is transmitted to the metal oxide semiconductor component 270 through the interconnect structure 220 so as to calculate the received sound signal.

In the wafer level package 200 of MEMS microphone and the manufacturing method thereof, the protective layer 280 formed on the supporting ring 240 is used to cover the MEMS diaphragm 230. Thus, the conventional package process using the metal cover is not need. Therefore, the wafer level package 200 of MEMS microphone has a low production cost. In addition, the wafer level package 200 of the MEMS microphone will not be damaged by the stress in the conventional package process.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A wafer level package of micro electromechanical system (MEMS) microphone, comprising:
   a substrate;
   a plurality of dielectric layers stacked on the substrate;
   a MEMS diaphragm disposed between two adjacent dielectric layers of the dielectric layers, and a first chamber being formed between the MEMS diaphragm and the substrate;
   a plurality of supporting rings disposed in some of the dielectric layers respectively and stacked with each other, and the supporting rings surrounding the MEMS diaphragm;
   a protective layer disposed on the upmost supporting ring and above the MEMS diaphragm, a second chamber being formed between the MEMS diaphragm and the protective layer, and the protective layer defining a plurality of first through holes for exposing the MEMS diaphragm therefrom; and
   a guard ring, wherein the guard ring is located in some of the dielectric layers under the MEMS diaphragm and surrounds the first chamber.

2. The wafer level package of MEMS microphone as claimed in claim 1, wherein material of the supporting rings comprises metal.

3. The wafer level package of MEMS microphone as claimed in claim 1, wherein material of the protective layer is selected from a group consisting of plastic, dielectric material and metal.

4. The wafer level package of MEMS microphone as claimed in claim 1, further comprising an electrode layer disposed either on the substrate or in the substrate, and the electrode layer defining a plurality of second through holes corresponding to the MEMS diaphragm and the substrate defining a hollow region corresponding to the MEMS diaphragm.

5. The wafer level package of MEMS microphone as claimed in claim 1, wherein material of the guard ring comprises metal.

6. The wafer level package of MEMS microphone as claimed in claim 1, wherein the undermost supporting ring and the MEMS diaphragm are respectively coupled to the guard ring.

7. The wafer level package of MEMS microphone as claimed in claim 1, further comprising:

a metal oxide semiconductor component disposed on the substrate, and the dielectric layers covering the metal oxide semiconductor component;

a plurality of conductive wires arranged in different layers; and a plurality of via plugs, wherein the conductive wires, the via plugs and the dielectric layers form an interconnect structure electrically connecting to the metal oxide semiconductor component, the dielectric layers and the conductive wires are stacked alternately, the via plugs are formed in the dielectric layers, and each via plug electrically connects to the two adjacent conductive wires corresponding thereto.

8. The wafer level package of MEMS microphone as claimed in claim 1, wherein the upmost supporting ring is completely overlaid by the protective layer.

9. The wafer level package of MEMS microphone as claimed in claim 1, wherein an inner diameter of the lower supporting ring is greater than that of the upper supporting ring, and the upmost supporting ring is located in the upmost dielectric layer.

10. A manufacturing method for wafer level package of micro electromechanical system (MEMS) microphone, comprising:

forming a plurality of dielectric layers on a substrate in sequence, forming a MEMS diaphragm between two adjacent dielectric layers of the dielectric layers and forming a plurality of supporting rings in some of the dielectric layers, wherein the supporting rings are stacked with each other, and the supporting rings surround the MEMS diaphragm;

forming a protective layer on the upmost supporting ring and above the MEMS diaphragm, and the protective layer defining a plurality of first through holes; and forming a first chamber between the MEMS diaphragm and the substrate, and forming a second chamber between the MEMS diaphragm and the protective layer, wherein during forming the dielectric layers, a guard ring is formed in some of the dielectric layers, and the undermost supporting ring is located on the guard ring and coupled to the guard ring.

11. The manufacturing method as claimed in claim 10, wherein the upmost supporting ring is located in the upmost dielectric layer, and an inner diameter of the lower supporting ring is greater than that of the upper supporting ring.

12. The manufacturing method as claimed in claim 10, wherein before the dielectric layers are formed in sequence, an electrode layer is formed either on the substrate or in the substrate.

13. The manufacturing method as claimed in claim 12, wherein the process of forming the first chamber comprises steps of:

removing a portion of the substrate under the MEMS diaphragm to form a hollow region so as to expose the electrode layer;

forming a plurality of second through holes in the electrode layer; and etching portions of the dielectric layers between the MEMS diaphragm and the electrode layer through the second through holes so as to form the first chamber.

14. The manufacturing method as claimed in claim 10, wherein material of the supporting rings comprises metal.

15. The manufacturing method as claimed in claim 10, wherein material of the protective layer is selected from a group consisting of plastic, dielectric material and metal.

16. The manufacturing method as claimed in claim 10, wherein before the dielectric layers are formed, a metal oxide semiconductor component is formed on the substrate, and then the dielectric layers are formed to cover the metal oxide semiconductor component.

17. The manufacturing method as claimed in claim 16, wherein during forming the dielectric layers, a plurality of conductive wires and a plurality of via plugs are formed, the conductive wires, the via plugs and the dielectric layers form an interconnect structure electrically connecting to the metal oxide semiconductor component, the dielectric layers and the conductive wires are stacked alternately, the via plugs are formed in the dielectric layers, and each via plug electrically connects to the two adjacent conductive wires corresponding thereto.

18. The manufacturing method as claimed in claim 10, wherein the upmost supporting ring is completely overlaid by the protective layer.

* * * * *